(12) United States Patent
Lim

(10) Patent No.: US 10,972,050 B1
(45) Date of Patent: Apr. 6, 2021

(54) TEMPERATURE- AND VOLTAGE-INDEPENDENT OSCILLATOR CIRCUIT

(71) Applicant: Samsung Electro-Mechanics Co., Ltd., Suwon-si (KR)

(72) Inventor: Tae Ho Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/856,410

(22) Filed: Apr. 23, 2020

(30) Foreign Application Priority Data

Dec. 26, 2019 (KR) .......................... 10-2019-0175323

(51) Int. Cl.
*H03B 5/24* (2006.01)
*H03K 3/011* (2006.01)
*H03K 4/502* (2006.01)
*H03K 3/0231* (2006.01)

(52) U.S. Cl.
CPC .............. *H03B 5/24* (2013.01); *H03K 3/011* (2013.01); *H03K 3/0231* (2013.01); *H03K 4/502* (2013.01)

(58) Field of Classification Search
CPC ........ H03K 3/0231; H03K 4/50; H03K 4/501; H03K 4/502; H03K 3/011; H03K 3/013
See application file for complete search history.

(56) References Cited

U.S. PATENT DOCUMENTS

| 5,604,467 A | * | 2/1997 | Matthews | ............... | H03K 3/011 323/907 |
| 7,123,105 B2 | * | 10/2006 | Kim | ........................ | H03L 1/022 331/66 |
| 2018/0167030 A1 | | 6/2018 | Wu et al. | | |
| 2020/0076409 A1 | * | 3/2020 | Hashimoto | ............ | H03K 3/011 |

FOREIGN PATENT DOCUMENTS

| KR | 10-2008-0061217 A | 7/2008 | |
| KR | 10-2018-0022986 A | 3/2018 | |
| WO | WO-2018218450 A1 * | 12/2018 | ............... H03B 5/04 |

* cited by examiner

*Primary Examiner* — Ryan Johnson
(74) *Attorney, Agent, or Firm* — NSIP Law

(57) ABSTRACT

A temperature- and voltage-independent oscillator circuit including a bias circuit configured to generate a reference voltage based on a reference current and a bias resistor; a signal generator circuit configured to generate a bias current based on the reference current, and generate an oscillation signal by repeatedly charging a capacitor using the bias current, and discharging the charged capacitor; and a control circuit configured to control the charging of the capacitor and the discharging of the charged capacitor based on the reference voltage and a voltage of the oscillation signal, wherein a period of the oscillation signal is determined by a resistance value of the bias resistor and a capacitance value of the capacitor.

14 Claims, 2 Drawing Sheets

TEMPERATURE- AND VOLTAGE-INDEPENDENT OSCILLATOR CIRCUIT

CROSS-REFERENCE TO RELATED APPLICATIONS

This application claims the benefit under 35 USC 119(a) of Korean Patent Application No. 10-2019-0175323 filed on Dec. 26, 2019, in the Korean Intellectual Property Office, the entire disclosure of which is incorporated herein by reference for all purposes.

BACKGROUND

1. Field

This application relates to a temperature- and voltage-independent oscillator circuit.

2. Description of Related Art

Generally, an oscillator circuit may generate an oscillation signal having a period. The period may be determined by a voltage or a current, and when the voltage or the current change in accordance with a change in a temperature, the period of the oscillation signal may change in accordance with the change in the temperature, thereby causing the oscillation signal to become unstable.

As an example, in a conventional oscillator circuit including a bandgap reference (BGR) circuit, a period T of an oscillation signal may be expressed by T=CV/I, where C denotes a capacitance value of a capacitor, denotes a voltage across the capacitor, and I denotes a charging the capacitor. The bandgap reference (BGR) circuit generates the voltage V independent of a temperature, so the conventional oscillator circuit is able to generate an oscillation signal having a temperature-independent period.

However, the bandgap reference (BGR) circuit has a relatively large size and is relatively expensive, so a manufacturing cost of a conventional oscillator circuit including the bandgap reference (BGR) circuit is high and there is a limit to how much the size of the oscillator circuit can be reduced.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a temperature- and voltage-independent oscillator circuit includes a bias circuit configured to generate a reference voltage based on a reference current and a bias resistor; a signal generator circuit configured to generate a bias current based on the reference current, and generate an oscillation signal by repeatedly charging a capacitor using the bias current, and discharging the charged capacitor; and a control circuit configured to control the charging of the capacitor and the discharging of the charged capacitor based on the reference voltage and a voltage of the oscillation signal, wherein a period of the oscillation signal is determined by a resistance value of the bias resistor and a capacitance value of the capacitor.

The bias circuit may include the bias resistor, the bias resistor may be configured to generate the reference voltage based on the reference current, and the signal generator circuit may include the capacitor, and may be further configured to determine the period of the oscillation signal.

The bias circuit may include a first current mirror circuit including a first pMOSFET (p-channel Metal-Oxide-Semiconductor Field-Effect Transistor) and a second pMOSFET connected to each other in a current mirror structure, the first current mirror circuit being configured to generate the reference current in the first pMOSFET; a self-bias circuit connected to the first current mirror circuit, and including a first nMOSFET (n-channel Metal-Oxide-Semiconductor Field-Effect Transistor) including a drain connected to a drain of the first pMOSFET, and a second nMOSFET including a drain connected to a drain of the second pMOSFET and a gate of the first nMOSFET, and a gate connected to a source of the first nMOSFET; and the bias resistor, wherein the bias resistor may be connected between the source of the first nMOSFET and a ground, and may be configured to generate the reference voltage based on the reference current.

The signal generator circuit may include a third pMOSFET connected to the first pMOSFET of the bias circuit in a current mirror structure, the third pMOSFET being configured to generate the bias current in the third pMOSFET by current mirroring the reference current based on a current mirror ratio equal to a W/L ratio of the third pMOSFET of the signal generator circuit divided by a W/L ratio of the first pMOSFET of the bias circuit, where W denotes a pMOSFET channel width, and L denotes a pMOSFET channel length.

The signal generator circuit may include a second current mirror circuit including a third pMOSFET connected to the first pMOSFET of the bias circuit in a current mirror structure, the second current mirror circuit being configured to generate the bias current in the third pMOSFET based on the reference current; and a charging and discharging circuit including the capacitor and a switch device, wherein the capacitor may be connected between the third pMOSFET and a ground, the switch device may be connected in parallel with the capacitor between the third pMOSFET and the ground, and may be configured to switch between an off-state and an on-state in response to control of the control circuit to generate the oscillation signal, the switch in the off-state may enable the bias current to flow from the third pMOSFET into the capacitor to charge the capacitor, and the switch in the on-state may enable the charged capacitor to discharge through the switch device to the ground.

The control circuit may be further configured to compare a voltage of the oscillation signal with the reference voltage, and generate a control signal for switching the switch device between the off-state and the on-state based on a result of the comparing, set a level of the control signal to an off-level for switching the switch device to the off-state in response to the voltage of the oscillation signal being less than the reference voltage, and set the level of the control signal to an on-level for switching the switch device to the on-state in response to the voltage of the oscillation signal being greater than the reference voltage, and the switch device may be further configured to receive the control signal, and switch between the off-state and the on-state in response to the level of the control signal in response to the level of the control signal changing between the off-level and the on-level.

The control circuit may include a comparator including an inverting input terminal configured to receive the reference voltage, a non-inverting input terminal configured to receive the oscillation signal, and an output terminal configured to output the control signal, and the comparator may be configured to compare the voltage of the oscillation signal with the reference voltage, and generate the control signal having the level set to the off-level or the on-level based on a result of the comparing.

The period of the oscillation signal may be equal to a product of the resistance value of the bias resistor and the capacitance value of the capacitor.

In another general aspect, a temperature- and voltage-independent oscillator circuit includes a bias circuit configured to generate a reference voltage based on a reference current and a bias resistor; a signal generator circuit connected to the bias circuit in a current mirror structure, and configured to generate a bias current based on the reference current and a current mirror ratio, and generate an oscillation signal by repeatedly charging a capacitor using the bias current, and discharging the charged capacitor; and a control circuit configured to control the charging of the capacitor and the discharging of the charged capacitor of the signal generator circuit based on the reference voltage and a voltage of the oscillation signal, wherein a period of the oscillation signal is determined by a resistance value of the bias resistor and a capacitance value of the capacitor.

The bias circuit may include the bias resistor, the bias resistor may be configured to generate the reference voltage based on the reference current, and the signal generator circuit may include the capacitor, and may be further configured to determine the period of the oscillation signal.

The bias circuit may include a first current mirror circuit including a first pMOSFET (p-channel Metal-Oxide-Semiconductor Field-Effect Transistor) and a second pMOSFET connected to each other in a current mirror structure, the first current mirror circuit being configured to generate the reference current in the first pMOSFET; a self-bias circuit connected to the first current mirror circuit, and including a first nMOSFET (n-channel Metal-Oxide-Semiconductor Field-Effect Transistor) including a drain connected to a drain of the first pMOSFET, and a second nMOSFET including a drain connected to a drain of the second pMOSFET and a gate of the first nMOSFET, and a gate connected to a source of the first nMOSFET; and the bias resistor, wherein the bias resistor may be connected between the source of the first nMOSFET and a ground, and may be configured to generate the reference voltage based on the reference current.

The signal generator circuit may include a third pMOSFET connected to the first pMOSFET of the bias circuit in a current mirror structure, and configured to generate the bias current in the third pMOSFET by current mirroring the reference current based on the current mirror ratio, and the current mirror ratio may be equal to a W/L ratio of the third pMOSFET of the signal generator circuit divided by a W/L ratio of the first pMOSFET, where W denotes a pMOSFET channel width, and L denotes a pMOSFET channel length.

The signal generator circuit may include a second current mirror circuit including a third pMOSFET connected to the first pMOSFET of the bias circuit in a current mirror structure, the second current mirror circuit being configured to generate the bias current in the third pMOSFET based on the reference current and the current mirror ratio; and a charging and discharging circuit including the capacitor and a switch device, wherein the capacitor may be connected between the third pMOSFET and a ground, the switch device may be connected in parallel with the capacitor between the third pMOSFET and the ground, and may be configured to switch between an off-state and an on-state in response to control of the control circuit to generate the oscillation signal, the switch in the off-state may enable the bias current to flow from the third pMOSFET into the capacitor to charge the capacitor, and the switch in the on-state may enable the charged capacitor to discharge through the switch device to the ground.

The control circuit may be further configured to compare a voltage of the oscillation signal with the reference voltage, and generate a control signal for switching the switch device between the off-state and the on-state based on a result of the comparing, set a level of the control signal to an off-level for switching the switch device to the off-state in response to the voltage of the oscillation signal being less than the reference voltage, and set the level of the control signal to an on-level for switching the switch device to the on-state in response to the voltage of the oscillation signal being greater than the reference voltage, and the switch device may be further configured to receive the control signal, and switch between the off-state and the on-state in response to the level of the control signal changing between the off-level and the on-level.

The control circuit may include a comparator including an inverting input terminal configured to receive the reference voltage, a non-inverting input terminal configured to receive the oscillation signal, and an output terminal configured to output the control signal, and the comparator may be configured to compare the voltage of the oscillation signal with the reference voltage, and generate the control signal having the level set to the off-level or the on-level based on a result of the comparing.

The period of the oscillation signal may be equal to a product of the resistance value of the bias resistor and the capacitance value of the capacitor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
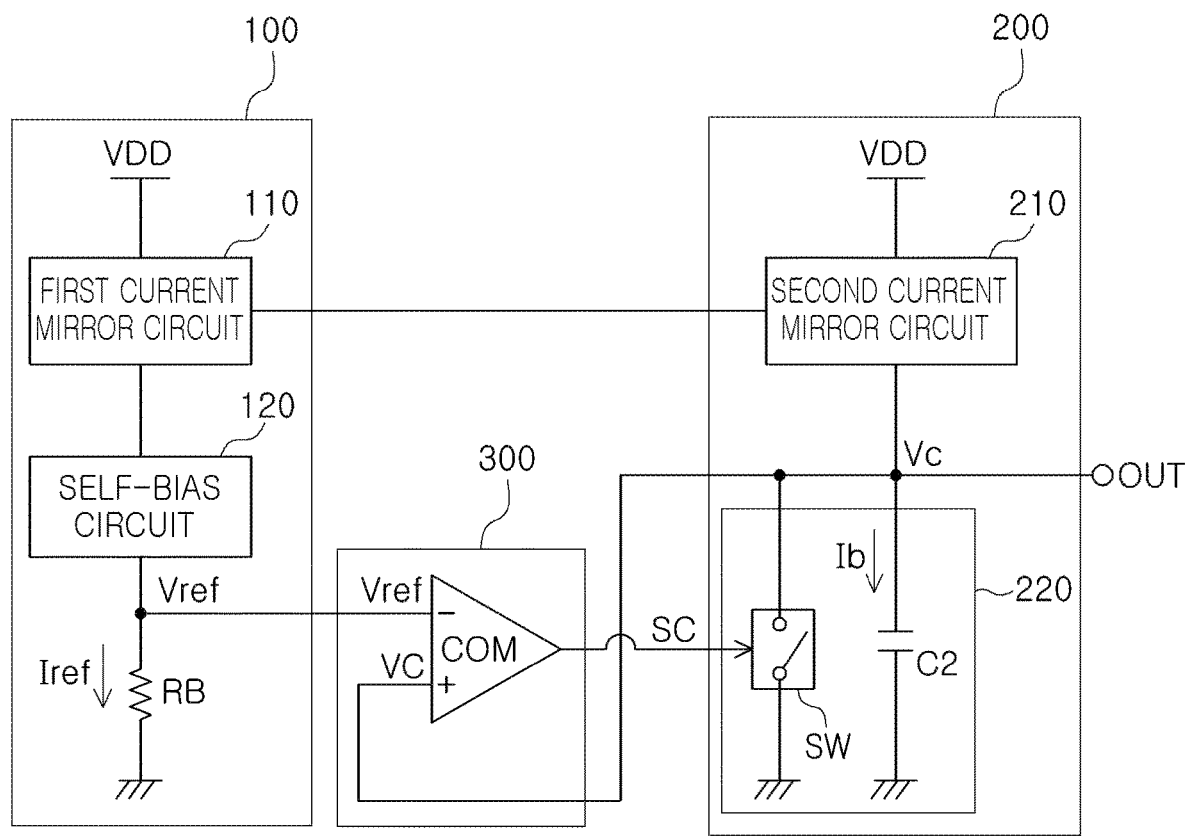
FIG. 1 is a diagram illustrating an example of a temperature- and voltage-independent oscillator circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when one element is described as being "connected to" or "coupled to" another element, the one element may be directly "connected to" or "coupled to" the other element, or there may be one or more other elements intervening therebetween. In contrast, when one element is described as being "directly connected to" or "directly coupled to" another element, there can be no other element intervening therebetween.

As used herein, the term "and/or" includes any one and any combination of any two or more of the associated listed items.

Although terms such as "first," "second," and "third" may be used herein to describe various elements, these elements are not to be limited by these terms. Rather, these terms are only used to distinguish one element from another element. Thus, a first element referred to in examples described herein may also be referred to as a second element without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram illustrating an example of a temperature- and voltage-independent oscillator circuit.

Referring to FIG. 1, a temperature- and voltage-independent oscillator circuit may include a bias circuit 100, a signal generator circuit 200, and a control circuit 300.

The bias circuit 100 may generate a reference voltage Vref based on a reference current Iref and a bias resistor RB.

The bias circuit 100 may include the bias resistor RB, and may determine the reference voltage Vref based on the reference current Iref and the bias resistor RB.

As an example, the bias circuit 100 may include a first current mirror circuit 110, a self-bias circuit 120, and the bias resistor RB.

The first current mirror circuit 110 and the self-bias circuit 120 may generate the reference current Iref.

The bias resistor RB may generate the reference voltage Vref based on the reference current Iref.

The signal generator circuit 200 may generate a bias current Ib based on the reference current Iref, and may generate an oscillation signal Vc by repeatedly charging a capacitor C2 using the bias current Ib, and discharging the charged capacitor C2.

As an example, the signal generator circuit 200 may include the capacitor C2, and may determine a period T of the oscillation signal Vc based on a resistance value of the bias resistor RB and a capacitance value of the capacitor C2.

As an example, the signal generator circuit 200 may include a second current mirror circuit 210 and a charging and discharging circuit 220.

The second current mirror circuit 210 may be connected to the first current mirror circuit 110 in a current mirror structure, and may generate the bias current Ib based on the reference current Iref of the first current mirror circuit 110. As an example, the second current mirror circuit 210 may include a third pMOSFET (p-channel Metal-Oxide-Semiconductor Field-Effect Transistor) PM2 connected to the first current mirror circuit 110 in a current mirror structure.

The charging and discharging circuit 220 may include the capacitor C2 and a switch device SW. The switch device SW may perform a charging operation of the capacitor C2 using the bias current Ib, and a discharging operation of the charged capacitor C2. As an example, the switch device SW may include an nMOSFET (n-channel Metal-Oxide-Semiconductor Field-Effect Transistor) NM2.

The control circuit 300 may control the charging operation and the discharging operation of the switch SW based on the reference voltage Vref and a voltage of the oscillation signal Vc.

The period T of the oscillation signal Vc may be determined based on the resistance value of the bias resistor RB and the capacitance value of the capacitor C2.

The control circuit 300 may compare a voltage of the oscillation circuit Vc with the reference voltage Vref, and may generate a control signal SC for controlling the charging operation and the discharging operation of the switch device SW based on a result of the comparing.

As an example, the control circuit 300 may include a comparator COM. The comparator COM may compare the voltage of the oscillation signal Vc with the reference voltage Vref, set a level of the control signal SC to an off-level for switching the switch device SW to an off-state in response to the voltage of the oscillation signal Vc being less than the reference voltage Vref, and set the level of the control signal SC to an on-level for switching the switch device SW to an on-state in response to the voltage of the oscillation signal Vc being greater than the reference voltage Vref.

As an example, when the switch device SW of the charging and discharging circuit 220 is in the off-state in response to the control signal SC input from the control circuit 300, the switch device SW charges the capacitor C2 using the bias current Ib to perform the charging operation. Conversely, when the switch device SW of the charging and discharging circuit 220 is in the on-state in response to the control signal SC input from the control circuit 300, the switch device SW discharges the charged capacitor C2 through the switch device SW to the ground to perform the discharging operation.

In the following description, redundant descriptions of features already described will be omitted, and only descriptions of differences will be provided.

Figure 2:
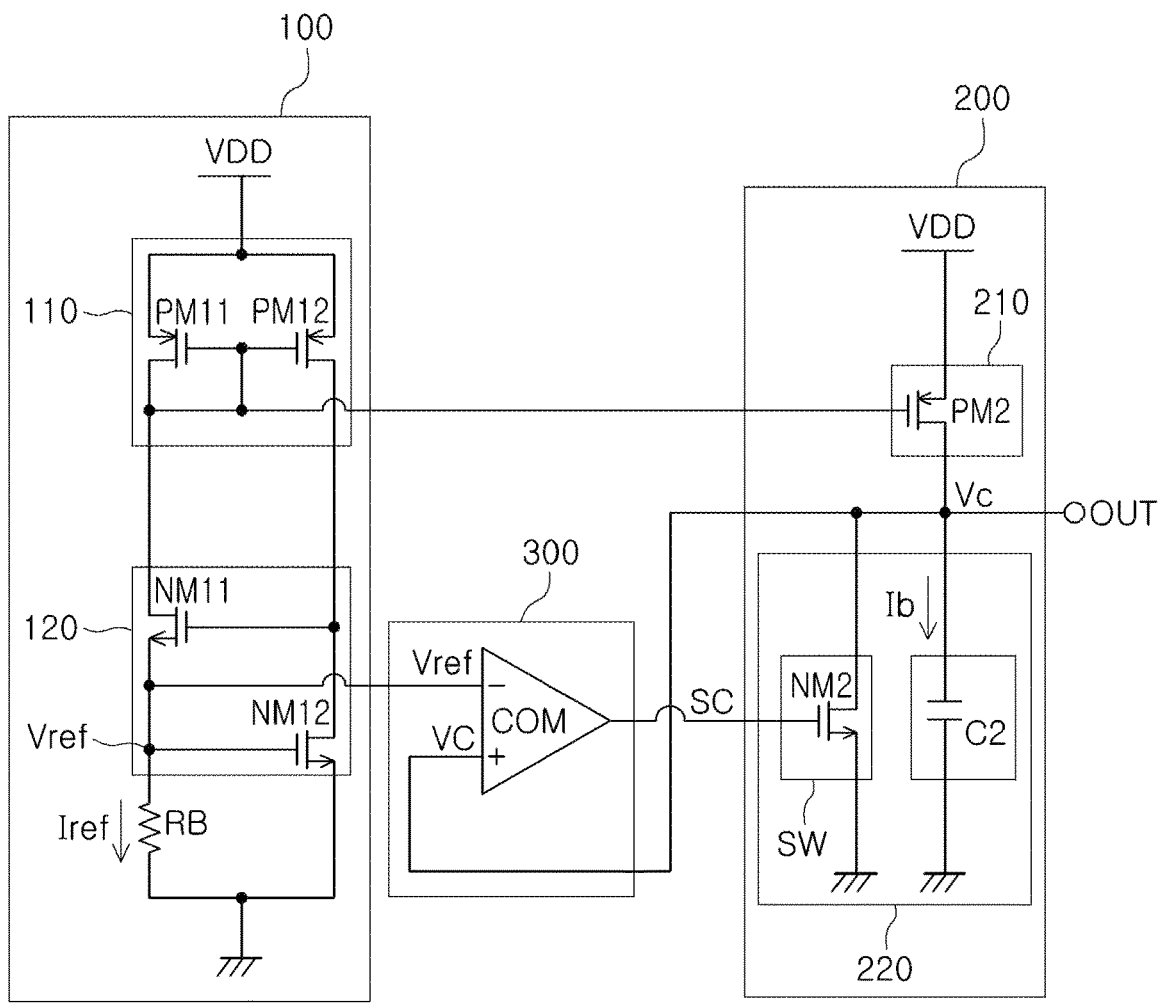
FIG. 2 is a diagram illustrating an example of an internal circuit of the temperature- and voltage-independent oscillator circuit of FIG. 1.

FIG. 2 is a diagram illustrating an example of an internal circuit of the temperature- and voltage-independent oscillator circuit of FIG. 1.

Referring to FIGS. 1 and 2, the first current mirror circuit 110 may include a first pMOSFET PM11 and a second pMOSFET PM12 connected to a power voltage VDD terminal and connected to each other in a current mirror structure, and may generate the reference current Iref. A gate and a drain of the first pMOSFET PM11 are connected to each other.

The self-bias circuit 120 may include a first nMOSFET NM11 and a second nMOSFET NM12 connected to the first current mirror circuit 110. A drain of the first nMOSFET NM11 may be connected to a drain of the first pMOSFET PM11, a gate of the first nMOSFET NM11 may be connected to a drain of the second pMOSFET PM12 and a drain of the second nMOSFET NM12, a source of the first nMOSFET NM11 may be connected to a gate of the second nMOSFET NM12, the source of the first nMOSFET NM11 and the gate of the second nMOSFET NM12 may be connected to the bias resistor RB, and a source of the second nMOSFET NM12 may be connected to a ground.

The bias resistor RB may be connected between the source of the first nMOSFET NM11 and the ground, and may generate the reference voltage Vref based on the reference current Iref.

The signal generator circuit 200 may be connected to the bias circuit 100 in a current mirror structure, and may generate the bias current Ib based on the bias circuit 100 and a current mirror ratio.

As an example, the signal generator circuit 200 may include a third pMOSFET PM2 connected to the first pMOSFET PM11 of the first current mirror circuit 110 in a current mirror structure.

As an example, the signal generator circuit 200 may include a second current mirror circuit 210 and a charging and discharging circuit 220.

The second current mirror circuit 210 may include the third pMOSFET PM2 connected to the first pMOSFET PM11 of the bias circuit 110 in a current mirror structure. The second current mirror circuit 210 may generate the bias current Ib by current mirroring the reference current Iref may be generated based on a current mirror ratio of the second current mirror circuit 210. The current mirror ratio is equal to a W/L ratio of the third pMOSFET PM2 of the second current mirror circuit 210 divided by a W/L ratio of the first pMOSFET PM11 of the first current mirror circuit 110, where W denotes a pMOSFET channel width and L denotes a pMOSFET channel length.

If a pMOSFET channel length L of the third pMOSFET PM2 is equal to a pMOSFET channel length L of the first pMOSFET PM11, then the bias current Ib current-mirrored from the reference current Iref may be generated based on a current mirror ratio equal to a pMOSFET channel width W of the third pMOSFET PM2 divided by a pMOSFET channel width W of the first pMOSFET PM11. For example, if the pMOSFET channel width W of the third pMOSFET PM2 divided by the pMOSFET channel width W of the first pMOSFET PM11 is equal to 2, then the current mirror ratio is 2 and Ib=2×Iref.

Accordingly, the signal generator circuit 200 may generate the oscillation signal Vc through the charging operation of the capacitor C2 using the bias current Ib and the discharging operation of the charged capacitor C2.

The charging and discharging circuit 220 may include the capacitor C2 and a switch device SW. The capacitor C2 may be connected between the third pMOSFET PM2 and a ground, and the switch device SW may be connected in parallel with the capacitor C2 between the third pMOSFET PM2 and the ground.

The switch device SW of the charging and discharging circuit 220 may perform a switching operation in response to the control signal SC of the control circuit 300. Accordingly, the switch device may perform the charging operation of the capacitor C2 using the bias current Ib flowing through the third pMOSFET PM2 and the discharging operation of the charged capacitor C2 to generate the oscillation signal Vc.

As an example, the control circuit 300 may include a comparator COM. The comparator COM may include an inverting input terminal receiving the reference voltage Vref, a non-inverting input terminal receiving the oscillation signal Vc, and an output terminal outputting the control signal SC having a level set based on a comparison between a voltage of the oscillation signal Vc and the reference voltage Vref.

Figure 3:
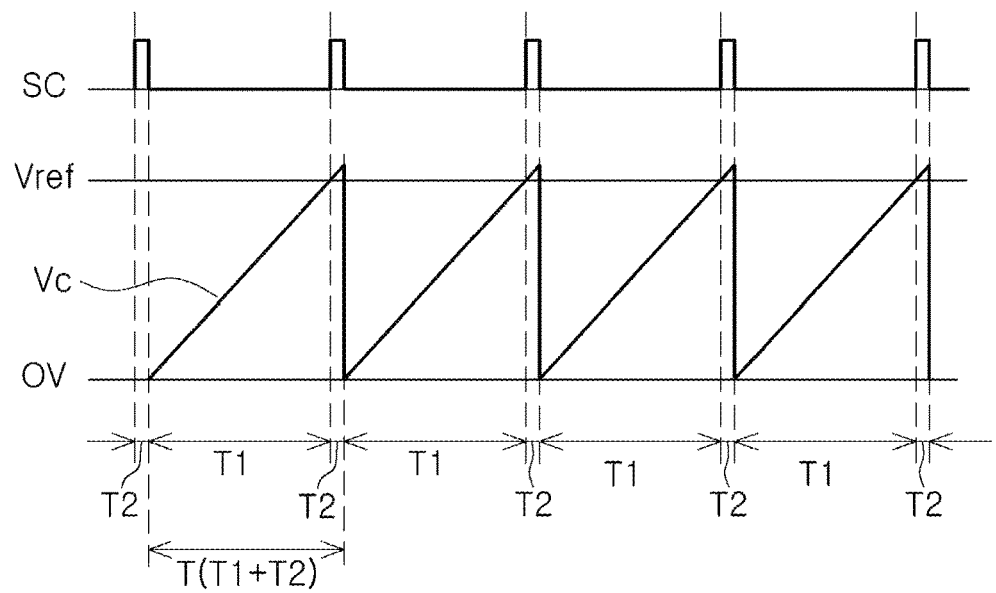
FIG. 3 is a diagram illustrating an example of an oscillation period of temperature- and voltage-independent oscillator circuit of FIG. 1.

FIG. 3 is a diagram illustrating an example of an oscillation period of the temperature- and voltage-independent oscillator circuit of FIG. 1.

Referring to FIGS. 1 to 3, a period T of the oscillation signal Vc is equal to a product (Rv×Cv) of the resistance value Rv of the bias resistor RB and the capacitance value Cv of the capacitor C2.

In the oscillator circuit, a total electric charge Q stored in the capacitor C2 is equal to a product of the capacitance value Cv and a voltage V across the capacitor C2, and may be represented by Equation 1 below.

In the oscillator circuit, a current I flowing to the capacitor C2 may be represented by Equation 2 below.

$$Q = Cv \times V \qquad (1)$$

$$I = Q/(T1+T2) \doteq (Cv \times V)/T1 \text{ (if } T1 \gg T2, T \doteq T1), \text{ or}$$
$$T1 \doteq (Cv \times V)/I \qquad (2)$$

In Equations 1 and 2, the period T illustrated in FIG. 3 may be T1+T2, and T1 may be much greater than T2. Thus, when T2 is not considered, the period T may be almost the same as T1.

In Equation 2, to represent V and I as functions independent of a temperature in the period T, V=Vref=Iref×Rv and I=Iref may be substituted, and Equation 2 may be rewritten as Equation 3 below.

$$T1 = (Cv \times V)/I = [Cv \times (Iref \times Rv)]/[Iref] = Cv \times Rv \qquad (3)$$

In Equation 3, Cv may be the capacitance value of the capacitor C2, and Rv may be the resistance value of the bias resistor RB.

Referring to Equation 3, the period T (=T1) may be represented by a product of the capacitance value Cv of the capacitor C2 and the resistance value Rv of the bias resistor RB, so the period T may be determined by a constant term independent of a temperature. Thus, in the oscillator circuit, an oscillation signal having a period and a frequency independent of a power voltage and a temperature may be implemented.

The examples of an oscillation circuit described above generate a temperature- and voltage-independent oscillation signal without using a conventional bandgap reference (BGR) circuit, thereby making it possible to reduce a manufacturing cost and a size of the oscillator circuit.

Also, by performing an oscillation operation independent of a temperature, changes in an output frequency due changes in temperature may be reduced.

Accordingly, a stable oscillation signal may be generated, and a manufacturing performance and a stability of an oscillation circuit may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A temperature- and voltage-independent oscillator circuit comprising:
   a bias circuit configured to generate a reference voltage based on a reference current and a bias resistor;
   a signal generator circuit configured to generate a bias current based on the reference current, and generate an oscillation signal by repeatedly charging a capacitor using the bias current, and discharging the charged capacitor; and
   a control circuit configured to control the charging of the capacitor and the discharging of the charged capacitor based on the reference voltage and a voltage of the oscillation signal,
   wherein a period of the oscillation signal is determined by a resistance value of the bias resistor and a capacitance value of the capacitor, and
   the period of the oscillation signal is equal to a product of the resistance value of the bias resistor and the capacitance value of the capacitor.

2. The temperature- and voltage-independent oscillator circuit of claim 1, wherein the bias circuit comprises the bias resistor,
   the bias resistor is configured to generate the reference voltage based on the reference current, and
   the signal generator circuit comprises the capacitor, and is further configured to determine the period of the oscillation signal.

3. The temperature- and voltage-independent oscillator circuit of claim 1, wherein the bias circuit comprises:
   a first current mirror circuit comprising a first pMOSFET (p-channel Metal-Oxide-Semiconductor Field-Effect Transistor) and a second pMOSFET connected to each other in a current mirror structure, the first current mirror circuit being configured to generate the reference current in the first pMOSFET;
   a self-bias circuit connected to the first current mirror circuit, and comprising a first nMOSFET (n-channel Metal-Oxide-Semiconductor Field-Effect Transistor) comprising a drain connected to a drain of the first pMOSFET, and a second nMOSFET comprising a drain connected to a drain of the second pMOSFET and a gate of the first nMOSFET, and a gate connected to a source of the first nMOSFET; and
   the bias resistor,
   wherein the bias resistor is connected between the source of the first nMOSFET and a ground, and is configured to generate the reference voltage based on the reference current.

4. The temperature- and voltage-independent oscillator circuit of claim 3, wherein the signal generator circuit comprises a third pMOSFET connected to the first pMOSFET of the bias circuit in a current mirror structure, the third pMOSFET being configured to generate the bias current in the third pMOSFET by current mirroring the reference current based on a current mirror ratio equal to a W/L ratio of the third pMOSFET of the signal generator circuit divided by a W/L ratio of the first pMOSFET of the bias circuit, where W denotes a pMOSFET channel width, and L denotes a pMOSFET channel length.

5. The temperature- and voltage-independent oscillator circuit of claim 3, wherein the signal generator circuit comprises:
   a second current mirror circuit comprising a third pMOSFET connected to the first pMOSFET of the bias circuit in a current mirror structure, the second current mirror circuit being configured to generate the bias current in the third pMOSFET based on the reference current; and
   a charging and discharging circuit comprising the capacitor and a switch device,
   wherein the capacitor is connected between the third pMOSFET and a ground,
   the switch device is connected in parallel with the capacitor between the third pMOSFET and the ground, and is configured to switch between an off-state and an on-state in response to control of the control circuit to generate the oscillation signal,
   the switch in the off-state enables the bias current to flow from the third pMOSFET into the capacitor to charge the capacitor, and
   the switch in the on-state enables the charged capacitor to discharge through the switch device to the ground.

6. The temperature- and voltage-independent oscillator circuit of claim 5, wherein the control circuit is further configured to:
   compare a voltage of the oscillation signal with the reference voltage, and generate a control signal for switching the switch device between the off-state and the on-state based on a result of the comparing,
   set a level of the control signal to an off-level for switching the switch device to the off-state in response to the voltage of the oscillation signal being less than the reference voltage, and
   set the level of the control signal to an on-level for switching the switch device to the on-state in response to the voltage of the oscillation signal being greater than the reference voltage, and
   the switch device is further configured to receive the control signal, and switch between the off-state and the on-state in response to the level of the control signal in response to the level of the control signal changing between the off-level and the on-level.

7. The temperature- and voltage-independent oscillator circuit of claim 6, wherein the control circuit comprises a comparator comprising an inverting input terminal configured to receive the reference voltage, a non-inverting input terminal configured to receive the oscillation signal, and an output terminal configured to output the control signal, and
   the comparator is configured to compare the voltage of the oscillation signal with the reference voltage, and generate the control signal having the level set to the off-level or the on-level based on a result of the comparing.

8. A temperature- and voltage-independent oscillator circuit comprising:
   a bias circuit configured to generate a reference voltage based on a reference current and a bias resistor;
   a signal generator circuit connected to the bias circuit in a current mirror structure, and configured to generate a bias current based on the reference current and a current mirror ratio, and generate an oscillation signal by repeatedly charging a capacitor using the bias current, and discharging the charged capacitor; and a control circuit configured to control the charging of the capacitor and the discharging of the charged capacitor of the signal generator circuit based on the reference voltage and a voltage of the oscillation signal, wherein a period of the oscillation signal is determined by a resistance value of the bias resistor and a capacitance value of the capacitor, and the period of the oscillation signal is equal to a product of the resistance value of the bias resistor and the capacitance value of the capacitor.

9. The temperature- and voltage-independent oscillator circuit of claim 8, wherein the bias circuit comprises the bias resistor, the bias resistor is configured to generate the reference voltage based on the reference current, and the signal generator circuit comprises the capacitor, and is further configured to determine the period of the oscillation signal.

10. The temperature- and voltage-independent oscillator circuit of claim 8, wherein the bias circuit comprises:

a first current mirror circuit comprising a first pMOSFET (p-channel Metal-Oxide-Semiconductor Field-Effect Transistor) and a second pMOSFET connected to each other in a current mirror structure, the first current mirror circuit being configured to generate the reference current in the first pMOSFET;

a self-bias circuit connected to the first current mirror circuit, and comprising a first nMOSFET (n-channel Metal-Oxide-Semiconductor Field-Effect Transistor) comprising a drain connected to a drain of the first pMOSFET, and a second nMOSFET comprising a drain connected to a drain of the second pMOSFET and a gate of the first nMOSFET, and a gate connected to a source of the first nMOSFET; and the bias resistor, wherein the bias resistor is connected between the source of the first nMOSFET and a ground, and is configured to generate the reference voltage based on the reference current.

11. The temperature- and voltage-independent oscillator circuit of claim 10, wherein the signal generator circuit comprises a third pMOSFET connected to the first pMOSFET of the bias circuit in a current mirror structure, and configured to generate the bias current in the third pMOSFET by current mirroring the reference current based on the current mirror ratio, and the current mirror ratio is equal to a W/L ratio of the third pMOSFET of the signal generator circuit divided by a W/L ratio of the first pMOSFET, where W denotes a pMOSFET channel width, and L denotes a pMOSFET channel length.

12. The temperature- and voltage-independent oscillator circuit of claim 10, wherein the signal generator circuit comprises:

a second current mirror circuit comprising a third pMOSFET connected to the first pMOSFET of the bias circuit in a current mirror structure, the second current mirror circuit being configured to generate the bias current in the third pMOSFET based on the reference current and the current mirror ratio; and a charging and discharging circuit comprising the capacitor and a switch device, wherein the capacitor is connected between the third pMOSFET and a ground, the switch device is connected in parallel with the capacitor between the third pMOSFET and the ground, and is configured to switch between an off-state and an on-state in response to control of the control circuit to generate the oscillation signal, the switch in the off-state enables the bias current to flow from the third pMOSFET into the capacitor to charge the capacitor, and the switch in the on-state enables the charged capacitor to discharge through the switch device to the ground.

13. The temperature- and voltage-independent oscillator circuit of claim 12, wherein the control circuit is further configured to:

compare a voltage of the oscillation signal with the reference voltage, and generate a control signal for switching the switch device between the off-state and the on-state based on a result of the comparing, set a level of the control signal to an off-level for switching the switch device to the off-state in response to the voltage of the oscillation signal being less than the reference voltage, and set the level of the control signal to an on-level for switching the switch device to the on-state in response to the voltage of the oscillation signal being greater than the reference voltage, and the switch device is further configured to receive the control signal, and switch between the off-state and the on-state in response to the level of the control signal changing between the off-level and the on-level.

14. The temperature- and voltage-independent oscillator circuit of claim 13, wherein the control circuit comprises a comparator comprising an inverting input terminal configured to receive the reference voltage, a non-inverting input terminal configured to receive the oscillation signal, and an output terminal configured to output the control signal, and the comparator is configured to compare the voltage of the oscillation signal with the reference voltage, and generate the control signal having the level set to the off-level or the on-level based on a result of the comparing.

* * * * *